US006353917B1

(12) United States Patent
Muddu et al.

(10) Patent No.: US 6,353,917 B1
(45) Date of Patent: Mar. 5, 2002

(54) DETERMINING A WORST CASE SWITCHING FACTOR FOR INTEGRATED CIRCUIT DESIGN

(75) Inventors: Sudhakar Muddu, Santa Clara; Egino Sarto, Palo Alto, both of CA (US)

(73) Assignee: Silicon Graphics, Inc., DE (US)

( * ) Notice: Subject to any disclaimer, the term of this patent is extended or adjusted under 35 U.S.C. 154(b) by 0 days.

(21) Appl. No.: 09/387,934

(22) Filed: Sep. 1, 1999

Related U.S. Application Data
(60) Provisional application No. 60/144,385, filed on Jul. 16, 1999.

(51) Int. Cl.[7] .......................... G06F 17/50; G06F 19/00
(52) U.S. Cl. ..................... 716/6; 716/2; 703/2; 703/16; 703/19; 702/64; 702/66
(58) Field of Search .................... 716/1–21; 702/64–67, 702/69–70; 703/2, 13–19

(56) References Cited

U.S. PATENT DOCUMENTS

| | | | |
|---|---|---|---|
| 5,285,165 A | 2/1994 | Renfors et al. ............. 328/167 |
| 5,481,695 A | * 1/1996 | Purks ........................... 703/15 |
| 5,535,133 A | * 7/1996 | Petschauer et al. ........... 716/19 |
| 5,568,395 A | * 10/1996 | Huang ............................ 716/4 |
| 5,692,160 A | * 11/1997 | Sarin ............................. 703/23 |
| 5,761,080 A | * 6/1998 | DeCamp et al. ................ 716/5 |
| 5,983,006 A | * 11/1999 | Carlson et al. ................. 716/4 |
| 6,128,769 A | * 10/2000 | Carlson et al. ................. 716/6 |
| 6,212,490 B1 | * 4/2001 | Li et al. ........................ 703/14 |
| 6,275,968 B1 | * 8/2001 | Dean et al. ..................... 716/2 |

OTHER PUBLICATIONS

NN86112774, "Calculation of AC Power in CMOS Circuits Using Simulation Data", IBM Technical Disclosure Bulletin, Nov. 1986, vol. 29, No. 6, pp. 2774–2775 (3 pages).*

NB9306505, "LSI Low Power Oriented Layout Method with Net Switching Factors", IBM Technical Disclosure Bulletin, vol. 36, No. 6B, Jun. 1993, pp. 505–508 (4 pages).*

Sakurai, "Closed–form expressions for interconnection delay, coupling and crosstalk in VLSIs", IEEE Transactions on Electron Devices, vol. 40, No. 1, Jan. 1993, pp. 118–124.*

Yim et al., "Reducing cross–coupling among interconnect wires in deep–submicron datapath design", Proceedings of 36th Design Automation Conference, Jun. 21, 1999, pp. 485–490.*

NN9503113, "Slew Rate Controlled Circuit", IBM Technical Disclosure Bulletin, vol. 38, No. 3, Mar. 1995, pp. 113–116 (3 pages).*

NB9406185, "Statistical Method of Noise Estimation in a Synchronous System", IBM Technical Disclosure Bulletin, vol. 37, No. 6B, Jun. 1994, pp. 185–194 (15 pages).*

Semiconductor Industry Association, National Technology Roadmap for Semiconductors, pages Table of Contents, pp. 1–3, 7–19, 23–113, 163–178, Appendix B1–C8, 1994.

Personal communication, SIA NTRS 1997 Revision, Design and Test Technology Working Group (chairs: R. Howard, P. Verhofstadt), 1997, Table of Contents, pp. 1–3, 8, 10–17, 25–38, 94–109, Appendix B, C and D, 1997.

C. J. Alpert and A. Devgan, "Wire Segmenting for Improved Buffer Insertion", Proc. Design Automation Conf., pp. 558–593, Jun. 1997.

D. P. LaPotin, U. Ghoshal, E. Chiprout, S. R. Nassif, "Physical Design Challenges For Performance", International Symposium on Physical Design, pp. 225–226, Apr. 1997.

L. Scheffer, "A Roadmap Of CAD Tool Changes For Sub––Micron Interconnect Problems", International Symposium on Physical Design, pp. 104–109, Apr. 1997.

R. F. Sechler, "Interconnect design with VLSI CMOS", IBM Journal of Research and Development, pp. 23–31, Jan.–Mar. 1995.

J. Cong, L. He, A.B. Kahng, D. Noice, N. Shirali and S. H.–C. Yen, Analysis And Justification Of A Simple, Practical 2 1/2–D Capacitance Extraction Methodology, Proc. Design Automation Conference, pp. 627–632, Jun. 1997.

L. Gwennap, "IC Vendors Prepare for 0.25–Micron Leap", Microprocessor Report, pp. 11–15, Sep. 16, 1996.

A. B. Kahng and S. Muddu, "Efficient Gate Delay Modeling For Large Interconnect Loads", Proc. IEEE Multi–Chip Module Conference, 6 pages, Feb. 1996.

S.Y. Oh, K.–J. Chang, N. Chang and K. Lee, "Interconnect Modeling And Design In High–Speed VLSI/ULSI Systems", Proc. International Conference on Computer Design: VLSI in Computers and Processors, pp. 184–189, Oct. 1992.

W. C. Elmore, "The Transient Response Of Damped Linear Networks with Particular Regard To Wideband Amplifiers," Journal of Applied Physics, vol. 19, Jan.–Dec. 1948, pp. 55–63.

A.B. Kahng and S. Muddu, "An Analytical Delay Model For RLC Interconnects," IEEE 1996, pp. 237–240.

A.B. Kahng, K. Masuko and S. Muddu, "Analytical Delay Models For VLSI Interconnects Under Ramp Input", IEEE/ACM International Conference on CAD, Nov. 1996, 7 pages.

A.B. Kahng and S. Muddu, "A Glossary On Analysis And Modeling Of VLSI Interconnections," marked Confidential, including Contents, Feb. 1996, 3 pages.

S.P. McCormick, "Modeling and Simulation of VLSI Interconnections with Moments," RLE Technical Report No. 543, PhD Thesis, MIT, May 1989.

J.K. Ousterhout, "A Switch–Level Timing Verifier For Digital MOS VLSI," IEEE Transactions on Computer–Aided Design, vol. CAD–4, No. 3, Jul. 1985, pp. 336–349.

P.R. O'Brien and T.L. Savarino, "Modeling the Driving––Point Characteristic Of Resistive Interconnect For Accurate Delay Estimation," Proc. IEEE, 1989, pp. 512–515.

P.R. O'Brien and T.L. Savarino, "Efficient On–Chip Delay Estimation For Leaky Models Of Multiple–Source Nets," Proc. IEEE 1990, Custom Integrated Circuits Conference, pp. 9.6.1–9.6.4.

L.T. Pillage, "Asymptotic Waveform Evaluation For Timing Analysis," IEEE Transactions on Computer–Aided Design, vol. 9, No. 4, Apr. 1990, pp. 352–366.

J. Qian, S. Pullela and L. Pillage, "Modeling The Effective Capacitance For The RC Interconnect Of CMOS Gates," IEEE Transactions on Computer–Aided Design of Integrated Circuits and Systems, vol. 13, No. 12, Dec. 1994, pp. 1526–1535.

J. Rubinstein, P. Penfield, Jr. and M.A. Horowitz, "Signal Delay In RC Tree Networks," IEEE Transactions on Computer–Aided Design, vol. CAD–2, No. 3, Jul. 1983, pp. 202–211.

C.L. Ratzlaff, S. Pullela and L. T. Pillage, "Modeling The RC–Interconnect Effects In A Hierarchical Timing Analyzer," IEEE Custom Integrated Circuits Conference, May 1992, pp. 15.6.1–15.6.4.

Synopsys, "Design Compiler Family Reference Manual," Version 3.3a, Mar. 1995, pp. 8–1–8–5.

H.B. Bakoglu, "Circuits, Interconnections, and Packaging for VLSI," Addison–Wesley Publishing Company, 1990, pp. 202–207, 212–215, 282–285.

A. Devgan, "Efficient Coupled Noise Estimation for On–Chip Interconnects," IEEE International Conference on Computer–Aided Design, Nov. 1997, pp. 147–151.

G.A. Katopis and H.H. Smith, "Coupled Noise Predictors for Lossy Interconnects,"IEEE Transactions on Components, Packaging, and Manufacturing Technology—Part B. vol. 17, No. 4, Nov. 1994, pp. 520–524.

H. Kawaguchi and T. Sakurai, "Delay and Noise Formulas for Capacitively Coupled Distributed RC Lines," Proc. Asian and South Pacific Design Automation Conference, 1998, pp. 35–43.

K. Rahmat, O.S. Nakagawa, S–Y. Oh and J. Moll, "A Scaling Scheme for Interconnect in Deep–Submicron Processes," IEEE International Electronic Devices Meeting, 1995, pp. 10.2.1–10.2.4.

K.L. Shepard, S.M. Carey, E.K. Cho, B.W. Curran, R.F. Hatch, D.E. Hoffman, S.A. McCabe, G.A. Northrop, R. Seigler, "Design Methodology for the S/390 Parallel Enterprise Server G4 Microprocessors," IBM Journal of Research and Development, vol. 41, No. 4/5, Jul./Sep. 1997, pp. 515–547.

A. Vittal and M. Marek–Sadowska, "Crosstalk Reduction for VLSI," IEEE Transactions on Computer–Aided Design of Integrated Circuits and Systems, vol. 16, No. 3, Mar. 1997, pp. 290–298.

G. Yee, R. Chandra, V. Ganesan and C. Sechen, "Wire Delay In the Presence of Crosstalk," ACM/IEEE International Workshop on Timing Issues in the Specification and Synthesis of Digital Systems, Dec. 97, pp. 170–175.

K.L. Shepard and V. Narayanan, "Conquering Noise in Deep–Submicron Digital Ics," IEEE Design & Test of Computers, Jan.–Mar. 1998, pp. 51–62.

K. Rahmat, J. Neves and J.F. Lee, "Methods for calculating coupling noise in early design: a comparative analysis," IEEE 1998, pp. 76–81.

R. Macys and S. McCormick, "A New Algorithm for Computing the Effective Capacitance in Deep Sub–micron Circuits," IEEE Custom Integrated Circuits Conference, 1998, pp. 313–316.

T. Sakurai, "Closed–Form Expressions for Interconnection Delay, Coupling, and Crosstalk in VLSI's", IEEE Transactions on Electron Devices, vol. 40, No. 1, pp. 118–124, Jan. 1993.

* cited by examiner

*Primary Examiner*—Caridad Everhart
*Assistant Examiner*—Phallaka Kik
(74) *Attorney, Agent, or Firm*—Squire Sanders & Dempsey LLP (57) ABSTRACT

Determining a switching factor is useful for optimizing integrated circuit (IC) design. One aspect of the invention is a method for determining the switching factor. The method includes applying a voltage to each interconnect of a pair of interconnects, each voltage having a waveform and a slew time. The method includes dividing the voltage waveform into time regions, and analyzing a behavior of a capacitor in each of the time regions by determining the value of an effective capacitance as seen from one of the interconnects. The method includes determining a total effective capacitance by time averaging the effective capacitance values and determining the switching factor from the total effective capacitance. The switching factor is a function of a ratio between the slew times, wherein a time-averaged effective value of the switching factor corresponds total effective capacitance. The time-averaged effective value of the switching factor is accounted for in optimizing the design of IC comments interconnections. The switching factor has a value that varies between zero (0) and a switching factor maximum value based on logic state switching conditions of the voltages including their respective waveforms, respective slew times, and relative start times and directions of switching. Another aspect of the invention is a method of optimizing IC components interconnections design with switching factor analysis. This method includes determining the switching factor for a pair of coupled interconnects under worst case conditions, the switching factor being a function of the ratio between slew rates of signals at the coupled interconnects.

12 Claims, 4 Drawing Sheets

Pi MODEL FOR LINES

DETERMINING A WORST CASE SWITCHING FACTOR FOR INTEGRATED CIRCUIT DESIGN

CROSS-NOTING TO PROVISIONAL APPLICATION

A claim is hereby made for the benefit under 35 U.S.C 119(e) of a U.S. provisional application Ser. No. 60/144,385, filed on Jul. 16, 1999, which is incorporated herein by reference.

RELATED APPLICATIONS

This application is related to and incorporates herein by reference the following co-pending applications: U.S. patent application Ser. No. 09/276,992 titled "Interconnect Capacitive Effects Estimation" and U.S. patent application Ser. No. 09/301,836 titled "Noise Estimation For Coupled RC Interconnects In Deep Submicron Integrated Circuits," which are assigned to the assignee of the present application.

FIELD OF THE INVENTION

This application relates to integrated circuit (IC) design and, specifically, to interconnect coupling effects on delay analysis in high speed, high density IC design.

BACKGROUND OF THE INVENTION

In order to achieve high speed operations of high density ICs, special attention is paid to the method of interconnecting various components in the IC. For high speed signals, a wire and its environment becomes a relatively complex circuit element along which the signals propagate with finite speed. Hence, a wire, also known in the context of ICs as an interconnect, net or line, is an important IC performance limiting factor. Therefore, special care is taken as to the characteristics of interconnects, their routing and the performance limiting factors associated with interconnects.

For instance, signal energy reflection returned along an interconnect to the signal origin point may cause ringing or a "bumpy" rising edge. To maintain the integrity of signals propagating through interconnects, the geometry (e.g., length) of interconnects is controlled relative to the rise time of signals. Additionally, interconnects configured as transmission lines are typically terminated with a resistance corresponding to the characteristic impedance of such interconnects.

As a further example, signal crosstalk between coupled interconnects can cause false switching and may accentuate signal propagation delays. Crosstalk is typically attributed to the capacitive coupling of closely proximate (e.g., parallel) interconnects, and the extent of crosstalk is influenced by the switching speed of signals. Crosstalk is also influenced by the geometry (e.g., length) of interconnects and the density of interconnects routing.

In order to determine the impact of crosstalk on the signal propagation delay, conventional timing analysis tools assume a coupling capacitance that is equivalent to a grounded capacitance multiplied by a factor known as the switching factor which depends upon the switching conditions. A switching factor of zero (0) is used for signals that switch in the same direction at both aggressor and victim interconnects. A switching factor of not higher than two (2.0) is customarily used for signals that switch in the opposite direction at the aggressor and victim interconnects. For use in delay and noise estimation a determination of a single effective capacitance value is made which characterizes the interconnect. The resulting effective capacitance is then multiplied by the switching factor.

In some cases, assuming a switching factor of 2.0 underestimates the delay effects of crosstalk. However, conventional IC design consistently employs this assumption. Accordingly, there remains a need for optimizing the design of interconnecting various components in the IC. The present invention addresses this and related problems.

SUMMARY OF THE INVENTION

A preferred embodiment of the present invention provides a more accurate determination of switching factor values for coupled interconnects. The switching factor values reflect the effects of capacitive coupling between interconnects and are used to optimize the design of interconnecting IC components. The present invention provides that the switching factor is derived from a ratio of slew times of aggressor and victim interconnects voltages. The present invention further provides that under worst case capacitive coupling the switching factor may be 3.0 or more.

For example, in accordance with the present invention, the switching factor under worst case conditions is 3.0 for linear ramp voltages and more than 3.0 for voltages with exponential waveforms. With the more accurate estimation of switching factor values, the present invention provides a more accurate representation of worst case scenarios for optimizing the design of IC components interconnections. In contrast with conventional methods where switching factor values are limited to 2.0, the more accurate estimation of the switching factor values overcomes the common problem of underestimating switching factor values. Moreover, the more accurate estimation of switching factors more closely addresses timing problems in critical interconnect coupling cases.

The present invention also provides model circuits, configured as lumped $\pi$ models, of the coupled interconnects for simpler and no less accurate switching factor and propagation delay analysis. The lumped $\pi$ models of the interconnects replace the coupled RC network model of the coupled interconnects, and the total effective capacitance (coupling capacitance modified by the switching factor, e.g., 3C) replaces each coupling capacitance. In other words, the coupled RC network model of the coupled interconnects is de-coupled with the lumped $\pi$ models, allowing individual analysis of each interconnect.

In accordance with the purpose of the invention, as embodied and broadly described herein, the invention relates to a method for determining a switching factor. The method includes applying a voltage to each interconnect of a pair of interconnects, each voltage having a waveform and a slew time. The method also includes dividing the voltage waveform into time regions, and analyzing a behavior in each of the time regions of a capacitor that represents capacitive coupling between the interconnects pair by determining a value of an effective capacitance as seen from one of the interconnects. The method further includes determining a total effective capacitance by time averaging the effective capacitance values, and determining the switching factor from the total effective capacitance.

The switching factor is a function of a ratio between the slew times, wherein a time-averaged effective value of the switching factor corresponds to the total effective capacitance. The time-averaged effective value of the switching factor is accounted for in optimizing a design of integrated circuit (IC) components interconnections. The value of the switching factor ranges between zero (0) and a maximum value, and it varies based on logic state switching conditions of the voltages including their respective waveforms and slew times, and their relative start times and directions of switching. The time-averaged effective value of the switching factor is three (3.0) for linear ramp voltage waveforms, and greater than three for non-linear voltage waveforms.

In further accordance with the purpose of the invention, as embodied and broadly described herein, the invention relates to a method of optimizing IC components interconnections design with switching factor analysis. The design optimizing method includes determining a switching factor for a pair of coupled interconnects under worst case conditions, the switching factor being a function of a ratio between slew rates of signals at the coupled interconnects. The method further includes modeling the pair of coupled interconnects using lumped $\pi$ (Pi) models each having a total effective capacitance that is scaled by the switching factor, and performing a time delay analysis using the lumped $\pi$ models. The effective capacitance represents a time-averaged coupling capacitance between the coupled interconnects. The switching factor is determined from the total effective capacitance.

Advantages of the invention will be set forth, in part, in the description that follows and, in part, will be understood by those skilled in the art from the description herein. The advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF A PREFERRED EMBODIMENT

The present invention optimizes the design of interconnecting various integrated circuits (ICs) components in order to achieve high speed operations of high density ICs. The IC design is optimized by more accurately determining a switching factor for coupled interconnects in the IC, wherein the switching factor is used in a timing analysis of the IC. The present invention provides also model circuits, lumped $\pi$ models, of the coupled interconnects for simpler yet accurate switching factor and time delay analysis.

Reference will now by made in detail to a preferred embodiment of the invention, examples of which are illustrated in the accompanying drawings. Wherever convenient, the same reference numbers will be used throughout the drawings to refer to the same of like parts.

In accordance with the preferred embodiment of the invention, special care is taken as to the characteristics of interconnects, their routing and the performance limiting factors that are associated with interconnects. For high speed signals, interconnects are performance limiting in that interconnects and their environment are relatively complex circuit elements along which the signals propagate with finite speed.

For instance, when a pair of interconnects, an "aggressor" and a "victim," are coupled, crosstalk between the coupled interconnects can cause false switching and may accentuate signal propagation delays. The impact of crosstalk between the coupled interconnects effects three components of delay: (i) the delay of a driver gate connected to the victim interconnect, (ii) the delay of the victim interconnect, and (iii) the delay of a load gate connected to the victim interconnect. Crosstalk is typically attributed to the capacitive coupling of interconnects, and the extent of crosstalk is influenced by the switching speed of signals. Crosstalk is also influenced by the geometry (e.g., length) of interconnects and the density of interconnects routing. More specifically, the impact of crosstalk on the signal propagation delay is determined by the coupling capacitance between the aggressor and victim interconnects, the rise time (slew rate) of the signals traveling across the aggressor interconnect, the size of drivers (gates) connected to the aggressor interconnect, the proximity of such drivers to a load gate connected to the victim interconnect, and a power bounce (glitch) at the supply of the driver and load gates which are connected to the victim interconnect (causing gate output voltage bump).

In order to determine the impact of crosstalk on propagation delay corresponding to the coupled interconnects, the timing analysis is typically performed using an effective capacitance that characterized the coupled interconnects, particularly the capacitive coupling between them. The effective capacitance is used for a more accurate evaluation of the delay characteristics of coupled interconnects.

In general, interconnect capacitance includes a self capacitance (also known as grounded capacitance), a fringe capacitance (to ground) and a coupling capacitance between the interconnect and a neighboring interconnect. The fringe and self capacitances of an interconnect are not affected by the switching behavior of a neighboring interconnect. By contrast, the coupling capacitance, is affected by the switching behavior of the neighboring interconnect since it is the capacitance between the interconnect and its neighboring interconnect.

The effective coupling capacitance depends on the behavior of voltages (signals) at both the interconnect and the neighbor interconnect. Hence, the coupling capacitance is expressed as an effective capacitance in each time region of the voltage waveform transition. To account for the entire voltage waveform transition, a total effective capacitance is a time-average of the effective capacitances. The total capacitance reflects more closely the capacitive coupling between the coupled interconnects.

Crosstalk and delay effects due to this capacitive coupling can be evaluated by determining interconnect-tointerconnect capacitances for signals on the same metal layer and top/bottom layers. To this end, and for a simpler and substantially accurate worst case delay analysis, a coupled RC network model representing the coupled interconnects is converted to an equivalent model, a lumped π model. Namely, the RC-network model is de-coupled so that each interconnect can be evaluated individually. To de-couple the coupled RC network model of the coupled interconnects, the total effective capacitance is modified by a switching factor (a capacitive coupling factor) which depends on signals switching conditions at the coupled interconnects.

It is noted that the self and fringe capacitances can be added to the scaled total effective capacitance to form a complete representation of the interconnect capacitance. This discussion focuses, however, on the total effective capacitance and the switching factor analysis. The switching factor analysis includes determining the time-averaged and maximum switching factor values.

As will be demonstrated in more detail below, the switching factor relates to the slew times of signals (voltages) at both the aggressor and victim interconnects. In the lumped π model, each coupling capacitance is replaced by an equivalent capacitance of three times (3C) its value (or more). (A simulation using a switching factor of 3.0 for comparing the coupled RC network model with the lumped π model indicates that propagation delays in the lumped π model are within 5% of the propagation delays in the coupled RC network.)

In practice, an optimized design takes into consideration a worst case scenario. For instance, in time delay analysis maximum delay conditions are considered in resolving set-up time violations and minimum delay conditions are considered in resolving hold-up time violations. In the case of ICs, in order to optimize the design of interconnecting IC components, the worst case scenario includes a highest switching factor value. As will be demonstrated, a time-averaged effective value of the switching factor is a more realistic value that may exceed a value of two (2.0) under worst case conditions. Under odd mode switching conditions (i.e. different switching times and directions for both interconnects), the time-averaged effective switching factor may reach a maximum value of three (3.0) or more. In other words, it will be shown that a propagation delay analysis that uses a switching factor value of not more than 2.0 may underestimate the effects of coupling and crosstalk, and, by comparison, a switching factor of 3.0 or more represents more closely the worst case conditions.

Under worst case conditions, the propagation time delay may produce a negative effect on the IC performance. Then, once the worst case conditions including the worst case propagation delay are known, the IC design, particularly the design of interconnecting the various IC components, can be optimized by taking special care to prevent the worst case conditions. This design optimization is possible if the value of the switching factor is not underestimated. The design is further optimized if the switching factor is not overestimated.

It is shown below that an equivalent capacitance of 3C represents a worst case for linear ramp voltages at the coupled interconnects. Specifically, a switching factor of 3.0 (and 3C) represents a worst case for linear ramp voltages if the rise time (or fall time) of the ramp voltage at the aggressor interconnect is at least twice as fast as the fall time (or rise time) of the ramp voltage at the victim interconnect. For non-linear voltage waveforms (such as exponential waveforms) the worst case value of the coupling capacitance may be higher than 3C.

Consistent with the foregoing, the ramp voltage at the aggressor interconnect is assumed to start and end the transition before the ramp voltage at the victim interconnect transitions to and reaches its reference voltage level. For this to occur, the difference in transition times should be equal to the slew time of the ramp voltage at the aggressor interconnect. It is noted that although each of the coupled interconnects may be driven with voltages at different levels, in practice the respective amplitudes of the voltages may be substantially equal, as is typically the case in ICs.

It is further noted that the analysis below applies to maximum as well as minimum propagation delay effects at the victim interconnect. As mentioned before, a maximum propagation delay may be worst case for set-up time and best case for hold-up time. Conversely, a minimum propagation delay may be worst case for hold-up time and best case for set-up time. The following discussion demonstrates various propagation delay scenarios that illustrate the interconnect coupling effect. In each of these scenarios, the switching factor is determined, where, as will be seen, higher switching factor values (>2.0) are possible.

For the most part, the following analysis illustrates the interconnect coupling effects for linear ramp voltage waveforms. However, the principles presented herein are applicable to other voltage waveforms. In fact, as mentioned above, non-linear waveforms may result in switching factors even higher than 3.0.

Switching Factor Analysis For Optimal Design—Complete Transition Overlap

Figure 1:
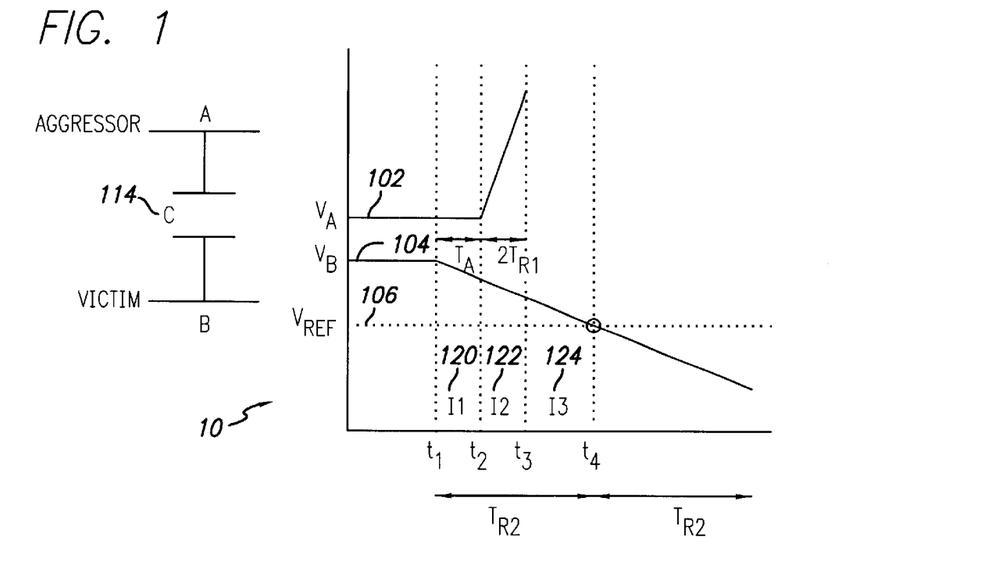
FIG. 1 is a timing diagram of voltage waveforms modeled as linear voltage ramps at nodes A and B of aggressor and victim interconnects, respectively.

The following analysis considers the case of a complete transition overlap, where the transition of voltage waveforms at aggressor interconnects completely overlaps the transition of voltage waveforms at the victim interconnect. FIG. 1 is a timing diagram 10 of voltage waveforms modeled as linear voltage ramps, $V_A$ and $V_B$, at nodes A and B of the aggressor and victim interconnects, respectively. Voltage $V_A$ 102 at node A of the aggressor interconnect is a fast rising ramp with a slew time of $2T_{R1}$. (Slew time represents the transition time—i.e., rise/fall time—for a 0 to 100% transition.) Voltage $V_B$ 104 at node B of the victim interconnect is a slow falling ramp with slew time of $2^xT_{R2}$ (i.e., $2T_{R2}$). Voltage $V_{REF}$ 106 represents a 50% threshold voltage which is used as a reference voltage for switching between different logic states.

It is noted that although for simplicity the diagram shows the graph of voltage $V_A$ 102 shifted upwards to a different level, in fact, voltages $V_A$ 102 and $V_B$ 104 are assumed to have an amplitude V and each of them is assumed to switch between the voltage levels of 0 and V. In other words, the graphs of voltages $V_A$ 102 and $V_B$ 104, are separated (shifted) to clarify the drawings. This applies to all the timing diagrams.

As mentioned before and as shown in FIG. 1, when the $T_{R2} \gg 2T_{R1}$ relationship is present the ramp voltage at the aggressor interconnect, $V_A$ 102, starts and ends the (0 to 100%) transition before the ramp voltage at the victim interconnect, $V_B$ 104, transitions to and reaches its reference voltage level, $V_{REF}$ 106. In other words, there is complete transition overlap of voltage $V_A$'s 102 transition with voltage $V_B$'s 104 transition. As is further shown, voltage $V_B$ 104 at node B starts its transition at time $t_1$ and reaches the $V_{REF}$ level at time $t_4$. Voltage $V_A$ 102 at node A starts its transition at time $t_2$ and reaches the final value at time $t_3$. $T_A$ represents a time span between the starting points of the respective transitions of voltages $V_B$ 104 and $V_A$ 102, and is the time difference between $t_1$ and $t_2$, i.e., $T_A = t_2 - t_1$.

Capacitor C 114 is a coupling capacitor with a static capacitance value of C. As shown, Capacitor C 114 is connected between nodes A and B, i.e., between the aggressor and victim interconnects. To determine an effective capacitance (and switching factor) as seen by node B at the victim interconnect, the behavior of the static capacitor C is analyzed in three different regions between time $t_1$ and $t_4$, regions $I_1$, 120, $I_2$ 122 and $I_3$ 124.

In region $I_1$ 120, voltage $V_A$ 102 at node A is constant (at logic state '0') while voltage $V_B$ 104 at node B is falling (switching from a logic state of '1'). In this region, node B sees an effective capacitance that is the same as the static capacitance value of C 114, i.e., $$C_{eff}^{I_1} = C.$$

In region $I_2$ 122, voltages $V_A$ 102 and $V_B$ 104 at nodes A and B are switching logic states in the opposite directions. In this region, the effective capacitance is thus determined by considering the individual currents that are drawn at each of nodes A and B. Since both voltages $V_A$ 102 and $V_B$ 104 are in transition, the current through capacitor C 114 reflects both voltages and is expressed as:

$$i_C^{AB} = C\frac{dV_A}{dt} = C\frac{dV_B}{dt} = C\left[\frac{V}{2T_{R1}} + \frac{V}{2T_{R2}}\right],$$

where V is the amplitude of voltages $V_A$ 102 and $V_B$ 104. It is noted that if $V_A$ 102 is, instead, held at constant voltage, the current through capacitor C 114 reflects only the voltage transition at node B and is given by:

$$i_C^B = C\frac{dV_B}{dt} = C\frac{V}{2T_{R2}},$$

where V is the amplitude of voltage $V_B$ 104.

For Voltage $V_A$ 102 to end its transition before $V_B$ 104 reaches the reference voltage level, Voltage $V_A$ 102 should start its transition at time at least $2T_{R1}$ before $V_B$ 104 reaches the level of $V_{REF}$ 106 (at $t_4$). This also maximizes the region, $I_2$ 122, where the transition of both voltages, $V_A$ 102 and $V_B$ 104, overlaps. (The effective capacitance in this region is also referred to as the overlap capacitance because it reflects the region where the transition of both voltages overlaps.)

Figure 2A:
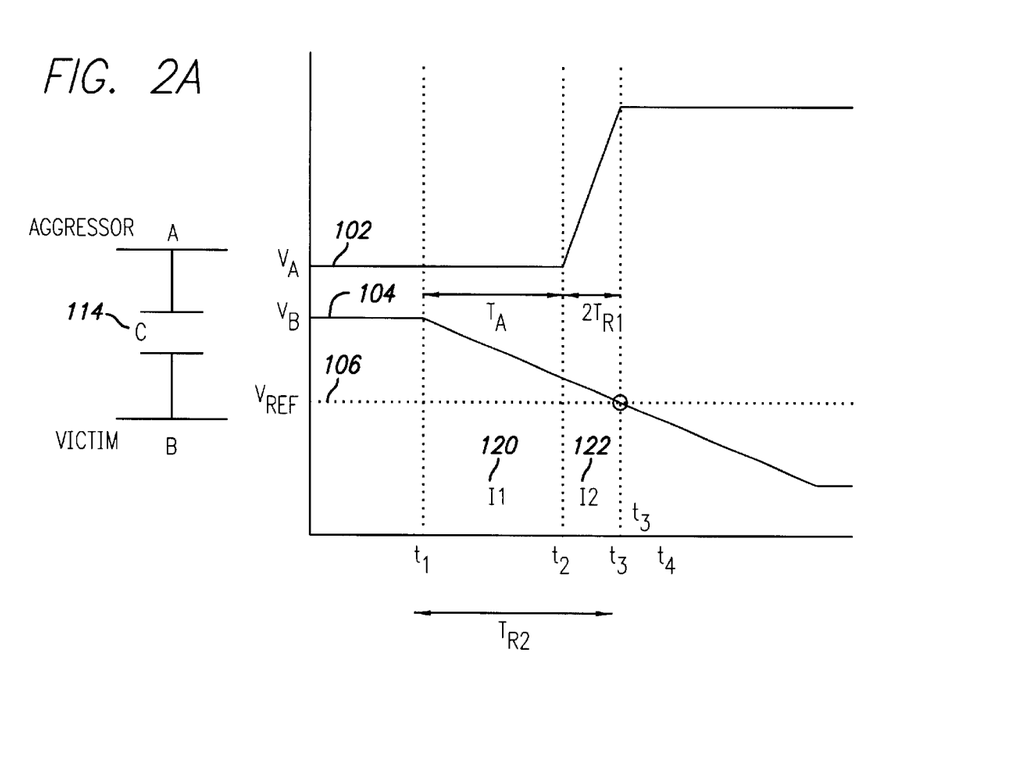
FIG. 2A is a timing diagram of the voltages of FIG. 1 which illustrates the transition of voltage at the victim interconnect as completely overlapping the transition of voltage at the aggressor interconnect. The voltages are shown switching logic states in the opposite directions.

Thus, for $t_2$, the transition starting point time for voltage $V_A$ 102, the following relationship exists:

$$t_2 \leq t_4 - 2T_{R1},$$

where $t_4$ is the time when voltage $V_B$ 104 reaches the reference voltage level and $2T_{R1}$ is the slew time of voltage $V_A$ 102. This case is illustrated in the FIG. 2A.

FIG. 2A is a timing diagram 10 of the voltages $V_A$ 102 and $V_B$ 104 of FIG. 1 which illustrates the transition of voltage $V_B$ 104 as completely overlapping and in the opposite direction as the transition of voltage $V_A$ 102. As shown, the voltage $V_A$ 102 transition starting time is $2T_{R1}$ before $t_4$. FIG. 2A illustrates a worst case (maximum delay) scenario where the fast transition at node A starts and ends during (i.e., overlaps with) the slow transition at node B as it is nearing the reference voltage level ($V_{REF}$ 106). In this configuration the time pointers $t_3$ and $t_4$ coincide and region $I_3$ 124 does not exists.

Figure 2B:
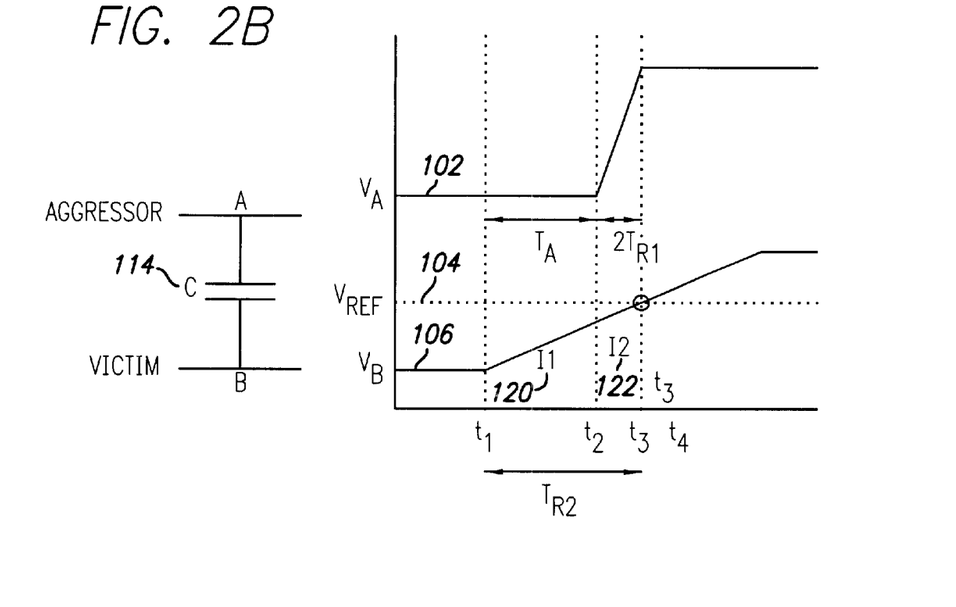
FIG. 2B illustrates a minimum delay scenario where both voltages of FIG. 1 switch logic states in the same direction.

FIG. 2B, by comparison to FIG. 2A, illustrates a minimum delay scenario where both voltages $V_A$ 102 and $V_B$ 104 of FIG. 1 switch logic states in the same direction. In this case, voltage $V_A$ 102 completes the transition before or when $V_B$ 104 reaches the reference voltage level, $V_{REF}$ 106.

For a voltage transition as illustrated in FIG. 2A, node B at the victim interconnect sees an effective capacitance which is proportional to a ratio of the above-mentioned currents during region $I_2$ 122, i.e., $$C_{eff}^{I_2} = C\frac{i_C^{AB}}{i_C^B} = C\left[1 + \frac{T_{R2}}{T_{R1}}\right].$$

This capacitance value represents a maximum $C_{eff}$ value, and the value of $1+T_{R2}/T_{R1}$ represents a maximum switching factor. It is noted that using these values can produce overly pessimistic delay estimates which may not be representative of real delay results. For this reason time-averaged values are obtained as will be explained below.

Finally, as shown in FIG. 1, in region $I_3$ 124, the voltage at node A, $V_A$ 102, is constant (at logic level '1') while the voltage at node B, $V_B$ 104, is still in transition, i.e., falling (switching to logic state '0'). The current through capacitor C 114 correlates to a voltage difference $\Delta V$ between nodes A and B, i.e., $$\Delta V = V_A - V_B$$

In region $I_3$ 120, this difference is lower than or equal to the difference in region $I_1$ 120. Hence, the effective capacitance as seen by node B at the victim interconnect is less than or equal to static capacitance C 114, i.e., $$C_{eff}^{I_3} \leq C_{eff}^{I_1} = C.$$

As mentioned before, since the coupling effects are important during voltage waveforms transition, a better representation is produced by a total capacitance that is a time-averaged effective capacitance. The total effective capacitance as seen by node B at the victim interconnect is expressed as a time-averaged effective capacitance:

$$C_{eff}^{tot} = \frac{T_A C_{eff}^{I_1} + 2T_{R1}C_{eff}^{I_2} + (T_{R2} - T_A - 2T_{R1})C_{eff}^{I_3}}{T_{R2}}$$

$$= \frac{T_A C + 2T_{R1}C\left[1 + \frac{T_{R2}}{T_{R1}}\right] + (T_{R2} - T_A - 2T_{R1})C_{eff}^{I_3}}{T_{R2}}.$$

From the foregoing equation and as shown in FIG. 2A, the total effective capacitance is maximized, i.e., representing the worst case (maximum delay), when:

$$T_A \leq T_{R2} = -2T_{R1}.$$

That is, region $I_1$ 120 and its contribution to the total effective capacitance is maximized and region $I_3$ 124 and its contribution to the total effective capacitance is minimized or eliminated. Accordingly, the total effective capacitance (time-averaged) in the worst case scenario is:

$$C_{eff}^{tot} = \frac{(T_{R2} - 2T_{R1})C + 2T_{R1}C\left(1 + \frac{T_{R2}}{T_{r1}}\right)}{T_{R2}} = 3C$$

It may be recalled that the foregoing equation applies to linear ramps at nodes A and B, $TR2 \geq 2TR1$, and $TA \leq (TR2-2TR1)$ or $t_2 \leq (t_4 - 2TR1)$.

As demonstrated, a worst-case capacitive coupling is reflected as a total effective capacitance of three (3.0) times C, the value of capacitance C 114 between nodes A and B. This means that the worst case switching factor for ramp input voltages is 3.0. Thus, using a switching factor value lower than 3.0 under the above-outlined conditions underestimates the worst case effect of interconnect capacitive coupling.

It is noted that for simplicity of the discussion only capacitive coupling effects are demonstrated. However, the principles of the invention apply also to cases with inductive coupling in addition to the capacitive coupling.

Switching Factor Analysis for Optimal Design—Partial Transition Overlap

The following discussion addresses a scenario in which the transition of voltage waveforms at aggressor interconnects is partially overlapped by the transition to reference voltage level of the voltage waveform at the victim interconnect. As seen from the above discussion the maximum coupling (and maximum delay) occurs if the linear ramp transition of voltage $V_A$ 102 fully overlaps the slower transition of voltage $V_B$ 104 and ends before or when voltage $V_B$ 104 reaches the reference voltage level. This transition overlap occurs (region $I_2$) when the transition start time of voltage $V_A$ 102 is $t_2 \leq (t_4 - 2TR1)$. The overlap time period can be expressed as $K_A T_{R1}$, where $K_A$ is between 0 to 2. For $K_A < 2$ the fast transition of voltage $V_A$ 102 partially overlaps with the slow transition of voltage $V_B$ 104.

Figure 3:
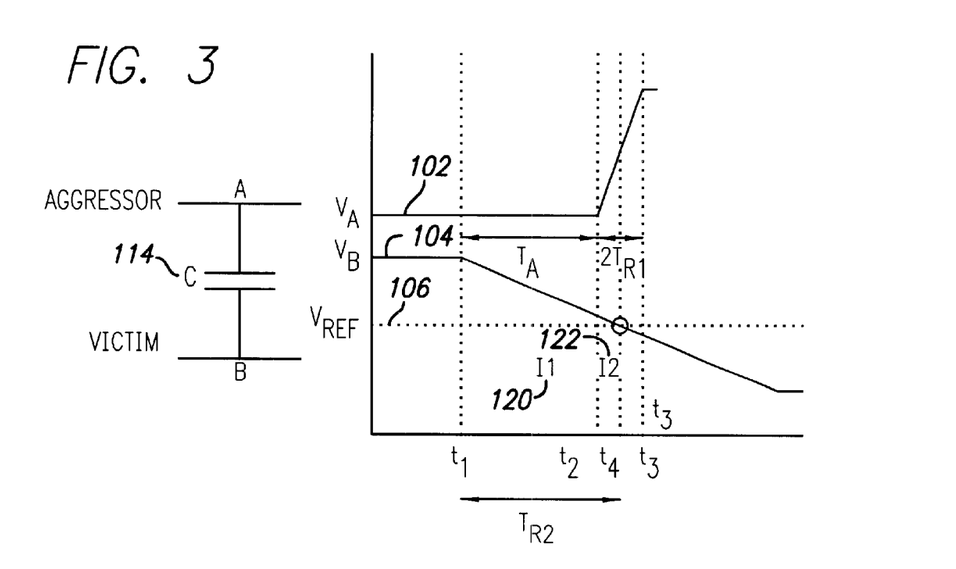
FIG. 3 shows a partial overlap of slew times for both voltages.

The partial overlap of slew times for both voltages is shown in FIG. 3. Note that in this scenario region $I_1$ is generally unchanged and region $I_2$ is partially attenuated. The overlap time period is $T_{R1}$ (i.e., $K_A=1$), and time point $t_3$ occurs after $t_4$. Accordingly, when the transition of voltage $V_A$ 102 partially overlaps the transition of voltage $V_B$, the total effective capacitance as seen from node B of the victim interconnect can be expressed as:

$$C_{eff}^{tot} = \frac{C(T_{R2} - K_A T_{R1}) + C\left(1 + \frac{T_{R2}}{T_{R1}}\right) K_A T_{R1}}{T_{R2}} = C(1 + K_A).$$

The above equation applies to linear ramps at nodes A and B, and $t_2 \leq t_4$ or $TA \leq TR2$. By comparison, if the voltage at node A starts the transition after the voltage at node B crosses the reference voltage ($V_{REF}$ 106) level, i.e., when $t_2 \geq t_4$ or $TA \geq T_{R2}$, the total effective capacitance as seen from node B is equal to C, the value of capacitance C 114.

Switching Factor Analysis for Optimal Design—Identical Slew times

In the case where both voltages $V_A$ 102 and $V_B$ 104 have identical slew times, i.e., $T_{R2}=T_{R1}$, the total effective capacitance is only due to the overlap capacitance (corresponding to region $I_2$; other regions do not exists). Accordingly, the total effective capacitance (overlap capacitance) for $T_{R2}=T_{R1}$ is:

$$C_{eff}^{tot/2} = C\frac{i_C^{AB}}{i_C^B} = C\left[1 + \frac{T_{R2}}{T_{R1}}\right]_{T_{R1}=T_{R2}} = 2C.$$

Switching Factor Analysis for Optimal Design—Non-linear Waveforms

In the previous section, the discussion considered linear ramp voltage waveforms in determining the switch factor. When the worst case of aggressor and victim interconnects coupling is simulated using non-linear waveforms instead of linear ramps, voltage $V_A$ 102 is non-linear around the (50%) reference voltage level. In this area, voltage $V_A$ 102 has small "bumps" and it makes modeling of gate delay characteristics more difficult. For a non-linear waveform gate delay cannot be computed using linear ramps or simple exponential waveforms. However, in practice, the voltage waveforms at both sides of the coupling capacitance (nodes A and B) are more likely to assume an exponential waveform. Thus, the voltages at nodes A and B may be approximated to an exponential waveform when determining the total effective capacitance (and switching factor).

The Effect of Switching on Gate Delay

The foregoing discussion addressed the effect of switching on the interconnects propagation delay. Thus far, the switching factor determination for optimal design characterized interconnects as distributed RC networks. The propagation delay of a driver gate connected to the victim interconnect may also be increased due to odd mode switching because the total load seen by this driver may be increased. However, by reason of a resistance shielding effect, this driver will not be effected by the full load capacitance as expressed above (e.g.: 3C).

Likewise, the propagation delay of a load gate connected at the other end of the victim interconnect may be increased because of the odd mode switching close to the reference voltage level. In fact, the signal waveform at the input of the load gate is nonlinear (i.e., exponential waveform with a bump) at the reference voltage level and slows down the signal switching. In any case, gate delays can be obtained from tables whose entries are computed as a function of slew time (assuming linear or exponential waveform) and fanout at the gate output.

Coupled RC Interconnects with Same/Opposite Side Drivers

Figure 4A:
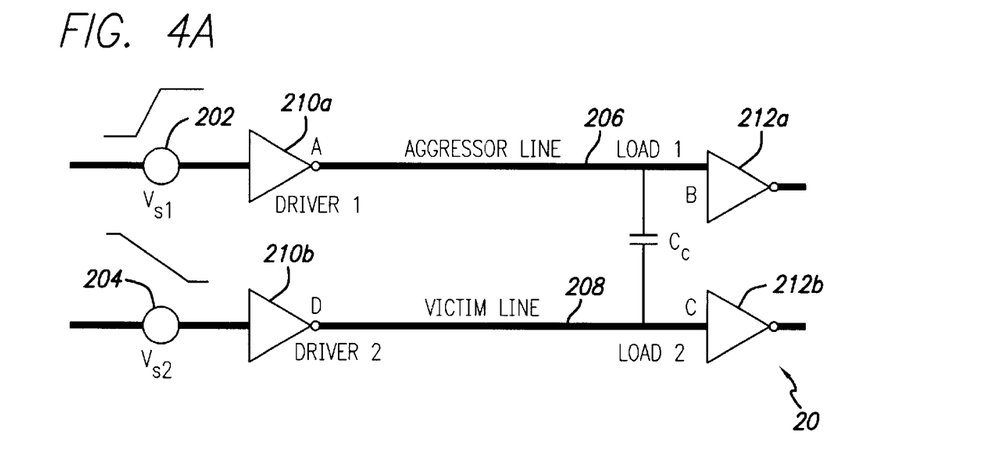
FIG. 4A is a diagram of coupled interconnects with inverters as driver and load gates.

The switching factors analysis considers a pair of coupled interconnects with driver and load gates attached as shown in FIG. 4A. FIG. 4A is a diagram of coupled interconnects 206 and 208 with inverters as driver and load gates 210 and 212. This configuration is used for the switching factor analysis to determine the impact of coupling (crosstalk) on the victim interconnect.

Figure 4B:
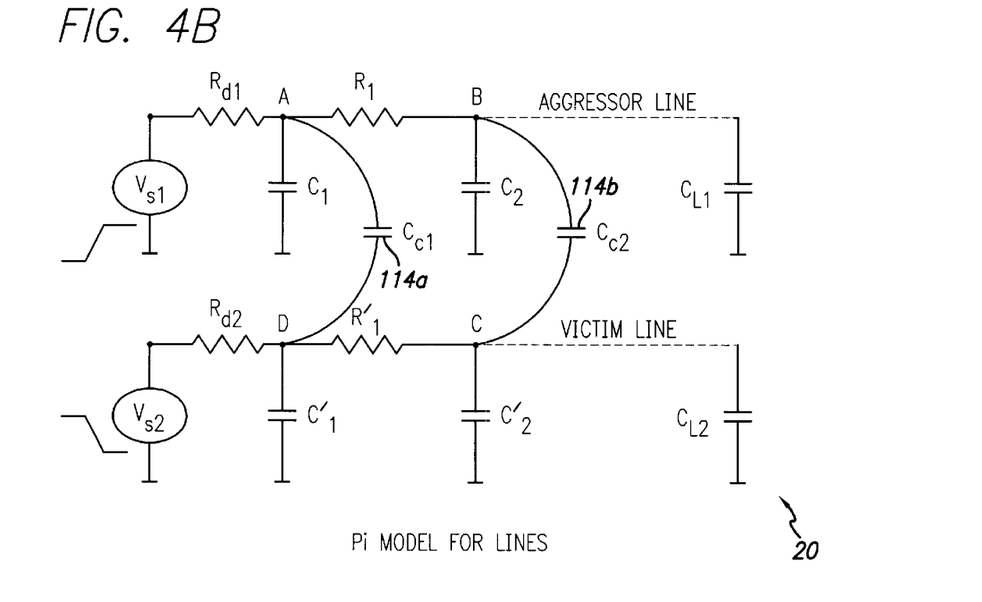
FIG. 4B shows, a coupled RC network model representing the coupled interconnects.
Figure 4C:
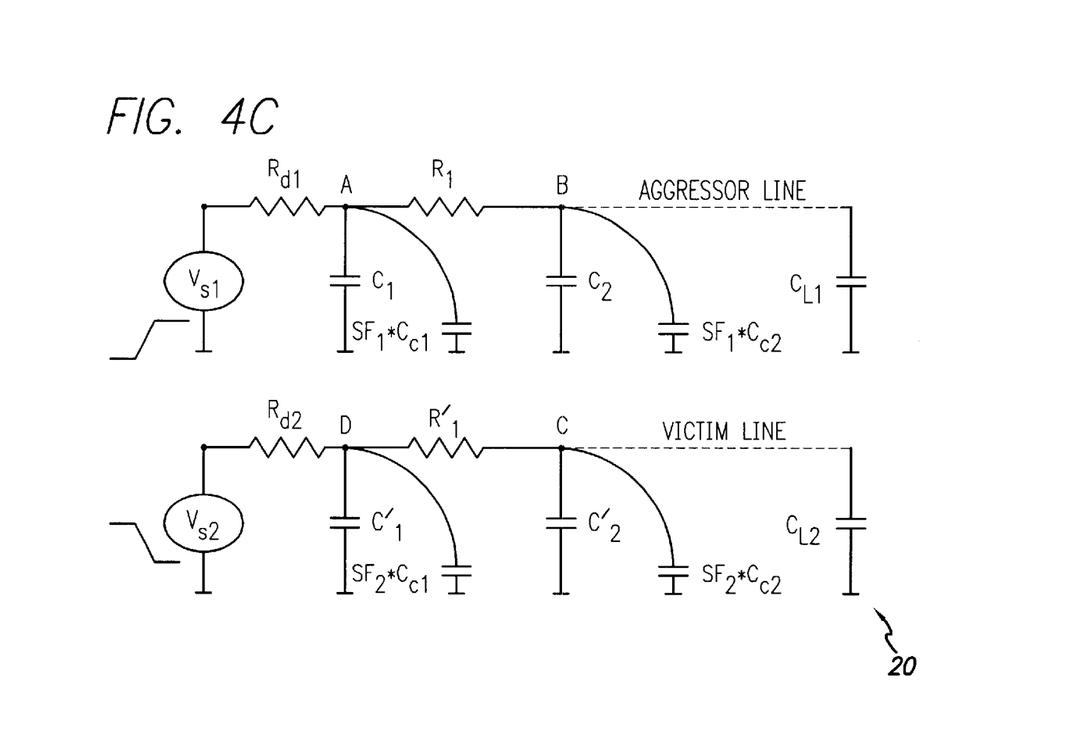
FIG. 4C shows lumped $\pi$ models of the coupled interconnects.

In this configurations both of the driver gates 210a and 210b are on the same side (i.e., left). The input voltages, $V_{S1}$ and $V_{S2}$ 202 and 204, are assumed to have different input voltage slew times. Equivalent circuits using a model of the interconnects and distributed coupling capacitances, i.e., a coupled RC network model, can be analyzed for determining a more accurate value of the interconnect propagation delays. It is later shown that it is possible to simplify the analysis without substantially degrading accuracy by converting the coupled RC network model to lumped π models of the coupled interconnects having a coupling capacitance scaled by the switching factor. (See: FIG. 4C and the delay results table.)

The switching factor values are separately determined for each interconnect in accordance with the above-described switching factor analysis for optimal design. For each interconnect, the switching factor is determined such that the (50%) threshold voltage level delay of the coupled RC network, as shown in FIG. 4B, matches the delay of the lumped π model as shown in FIG. 4C. Assuming worst case switching factors (for optimal design) of $SF_2$ and $SF_1$ for the victim and aggressor interconnects, respectively, the two switching factors are different for any configuration of input voltage slew times. The switching factors analysis can be done with various configurations (e.g., width and spacing) of (parallel or closely proximate) coupled interconnects, as presented for example in the following interconnect parameters table (in all cases an inverter gate capacitance, $C_L$, is 91.5 μF):

| Cases | width (in μm) | spacing (in μm) | Actual length (in μm) | $R_{int}$ (in Ω) | $C_{gnd}$ (in μF) | $C_{coup}$ (in μF) |
|---|---|---|---|---|---|---|
| 1 | 0.32 | 0.36 | 1200 | 229.117 | 62.94 | 84.00 |
| 2 | 0.32 | 0.36 | 2000 | 381.862 | 104.9 | 140.00 |
| 3 | 0.84 | 0.76 | 5000 | 363.679 | 569.89 | 170.10 |

The next table describes interconnect propagation delay results for the above-mentioned interconnect model configurations:

| | | 50% threshold delay (μs) | | |
|---|---|---|---|---|
| Cases | Coupled model | Lumped model (SF = 1.0) | Lumped model (SF = 2.0) | Lumped model (SF = 3.0) |
| 1 | 60 | 38 | 47 | 57 |
| 2 | 134 | 80 | 104 | 128 |
| 3 | 205 | 154 | 178 | 201 |

The "coupled model" (first) column, describes the delay time (μs) results for the coupled RC network model of the coupled interconnects (FIG. 4B). Each of the "lumped model" (second through fourth) columns describes the delay results for lumped π models (FIG. 4C). In essence, this table provides a comparison of 50% threshold voltage level delays for coupled interconnect circuits and for various switching factor values.

Figure 4D:
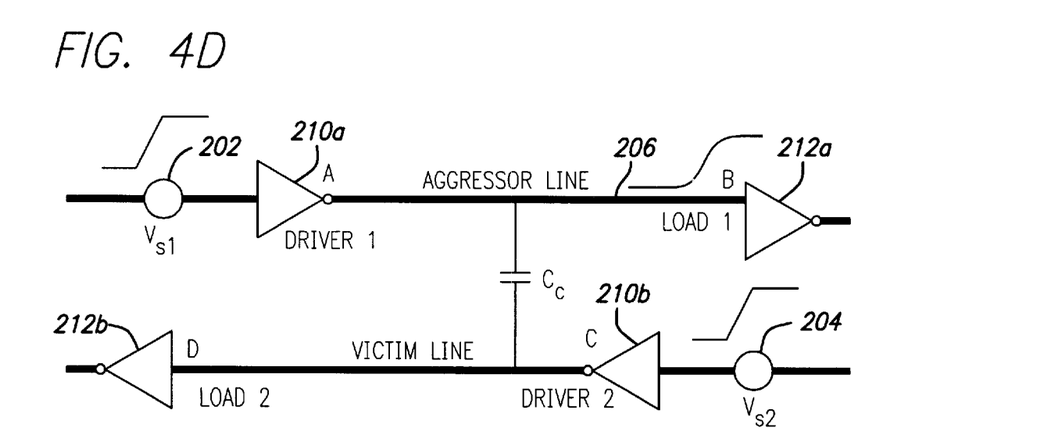
FIG. 4D is a diagram of coupled interconnects with inverters as driver and load gates.

The switching factors analysis may also consider a pair of coupled interconnects with driver and load gates attached as shown in FIG. 4D, where the driver gates 210a and 210b are on the opposite side (i.e., left and right). This configuration is an example of real VLSI circuits with fast slew time of voltage $V_A$ and slow slew time of voltage $V_B$ at the aggressor and victim interconnects, respectively. FIG. 4D is a diagram of coupled interconnects 206 and 208 with inverters as driver and load gates 210 and 212. This configuration also is used for the switching factor analysis to determine the impact of coupling (crosstalk) on the victim interconnect.

In this configurations, an equivalent circuit using π (Pi) models of the interconnects and distributed coupling capacitances, i.e., a coupled RC network, can be analogously analyzed for determining interconnect propagation delays. As with the previous example, the analysis can be simplified by converting the coupled RC network to lumped π models with a coupling capacitance scaled by the switching factor.

As mentioned, the configuration of FIG. 4D is used in a switching factor analysis for the victim interconnect. In this configuration when the voltage (e.g., $V_B$) reaches the load gate at the end of the victim interconnect, the voltage has at that point a large exponential waveform due to parasitic capacitances and alike along the victim interconnect. Then, if the voltage (e.g., $V_A$) at the aggressor interconnect switches logic states just before the voltage at the victim interconnect reaches the reference voltage level (say 50% threshold), the above described worst case delay scenario occurs. The effective coupling capacitance can be as high as three times the static capacitance assuming linear ramp waveforms. The effective coupling capacitance can be even higher assuming exponential waveforms for the input voltages.

Design Consideration for Controlling Switch Factor Values and Reducing Interconnect Coupling Effects A static timing tool may be implemented to screen or identify the coupled interconnects which are likely to experience the above described odd mode switching of aggressor and victim interconnect voltages. To handle various switching configurations, an interval timing predictor may be built into the static timing tool. Its function is to apply the proper switching factor (which is a function of aggressor and victim interconnect voltages slew time) to the coupling capacitances of neighboring lines to create an effective capacitance to ground. The static timing tool should also be capable of handling distributed RC interconnects by cross checking with other analysis tools results if the above described effective switching factor analysis provides insufficient accuracy.

With respect to IC components design, there are various techniques that can be employed to reduce the odd mode switching. These techniques include, for example, making the size of driver gates connected to the victim interconnect as large as possible, and/or reducing the load so that the fanout seen by driver gates is reasonable (e.g., fanout less than 6 for 0.15 μm technology). These factors will have a big impact of the slew time at the output of the driver gate (or at the input of the victim interconnect). A second technique is to reduce the size of driver gates connected to the aggressor interconnect so to reduce switching speed of aggressor voltages. A third technique is to reduce the coupling capacitance by increasing the space between the coupled lines or by introducing a shield line or ground planes between the interconnects. A fourth technique is to avoid the placement of coupled lines with opposite driver gates. Even though the slew time at the input of both driver gates may be small, when the signal reaches the load at the end of the interconnect, the slew times may be very large (long exponential tail) due to RC degradation. It would be detrimental to have a large driver gate switching at that location. A fifth technique is to reduce victim and aggressor interconnects resistance and capacitances. Finally, the design of noise tolerant gates reduces the problem of worst case switching factors. The use of schmitt triggers, for example, can increase the noise margins to greater than 50% of $V_{CC}$ (power voltage level), and the use of half-latches may speed up the recovery of an interconnect from a noise glitch. Such techniques may be employed singly or in combination to improve IC performance.

With respect to routing, several considerations apply to routing and placement tools. Routers need to be calibrated to route with various wire pitch rules for different metal layers and use large pitch (or spacing) rules for critical interconnects. Routers need to space interconnects as much as possible and add shield lines where space is available given the area and density constraints. Routing and placement tools need to keep track of the length of interconnects so that maximum length constraint is not violated for noise and switching factors control. Routers need to correspond to a repeater methodology for inserting repeaters such that interconnect delay are kept below a threshold limit (optimal repeater insertion delay). Routers should also keep track of the direction of signals propagation in order to spot coupled interconnects driven by opposite side driver gates as discussed above. Finally, critical signals which needs special attention are usually routed in higher metal layers next to power/ground lines. Usually, filling the metal layers above and below a signal (especially for large buses) helps reduce the effects of interconnects coupling.

With respect to semiconductor fabrication, variations the fabrication process can vary interconnects thickness, width and spacing by at least 10%. These variations may result in a variation in coupling capacitances coefficient and should be accounted for in the timing analysis.

Any one of the above considerations and techniques may be used, either singly or in combination, to improve the IC performance. In any case, however, proper estimation of the switching factors is needed in order to optimize the design by preventing or mitigating the effects of interconnects coupling.

In summary, the present invention more accurately derives the switching factor values for coupled interconnects. The switching factor values reflect the effects of capacitive coupling between interconnects and are used to optimize the design of interconnecting IC components. The present invention provides that the switching factor is derived from the slew times ratio of aggressor and victim interconnects voltages. The present invention further provides that under worst case capacitive coupling the switching factor may be 3.0 or more. For example, in accordance with the present invention, the switching factor under worst case conditions is 3.0 for linear ramp voltages and more that 3.0 for voltages with exponential waveforms. With the more accurate estimation of switching factor values, the present invention provides a more accurate representation of worst case scenarios for optimizing the design of IC components interconnections. The more accurate estimation of the switching factor values overcomes the common problem of underestimating switching factor values, in contrast with conventional methods where the switching factor values are limited to 2.0. Moreover, the more accurate estimation of switching factors more closely addresses timing problems in critical interconnect coupling cases. The present invention also provides a model circuit, a lumped $\pi$ model of the interconnects, for simpler and no less accurate switching factor and propagation delay analysis. The lumped $\pi$ model of the interconnects replaces the coupled RC network model, and the total effective capacitance (coupling capacitance modified by the switching factor, e.g., 3C) replaces each coupling capacitance. As demonstrated above, the experimental delay results for various switching factors match closely with the analytical observations.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A method comprising:
    applying a voltage to each interconnect of a pair of interconnects, each voltage having a waveform and a slew time;
    dividing the voltage waveform into time regions;
    analyzing a behavior in each of the time regions of a capacitor that represents capacitive coupling between the interconnects pair by determining a value of an effective capacitance as seen from one of the interconnects;
    determining a total effective capacitance by time averaging the effective capacitance values for all time regions;
    determining a switching factor from the total effective capacitance, the switching factor being a function of a ratio between the slew times, wherein a time-averaged effective value of the switching factor corresponds to the total effective capacitance; and
    designing an integrated circuit (IC) using the determined switching factor.

2. The method of claim 1, wherein the time-averaged effective value of the switching factor is accounted for in optimizing a design of IC components interconnections.

3. The method of claim 1, wherein a value of the switching factor ranges between zero (0) and a maximum value, the switching factor value varying based on logic state switching conditions of the voltages including respective waveforms of the voltages and slew times of the voltages, and relative start times of the voltages and directions of switching.

4. The method of claim 3, wherein the maximum value of the switching factor is one plus a ratio between the slew times $(1+T_{R2}/T_{R1})$ for linear ramp voltage waveforms.

5. The method of claim 1, wherein the time-averaged effective value of the switching factor is three (3.0) for linear ramp voltage waveforms.

6. The method of claim 1, wherein the time averaged effective value of the switching factor is greater than three for non-linear voltage waveforms.

7. A method comprising:
    determining a switching factor for a pair of coupled interconnects under worst case conditions, the switching factor being a function of a ratio between slew rates of signals at the coupled interconnects;
    modeling the pair of coupled interconnects using lumped $\pi$ (Pi) models each having a total effective capacitance that is scaled by the switching factor;
    performing a time delay analysis using the lumped $\pi$ models; and
    optimizing integrated circuit (IC) components interconnections design by utilizing the determined switching factor.

8. The method of claim 7, wherein the effective capacitance represents a time-averaged coupling capacitance between the coupled interconnects.

9. The method of claim 7, wherein the switching factor has a value that can vary from zero (0) to a highest value based upon signal switching conditions such as signal waveforms, relative slew rates and transitions start times and directions.

10. The method of claim 7, wherein the signals have a waveform, and wherein a time-averaged effective value of the switching factor is three for linear ramp waveforms.

11. The method of claim 7, wherein the signals have a waveform, and wherein a time-averaged effective value of the switching factor is greater than three for non-linear waveforms.

12. The method of claim 7, wherein the signals have a waveform, wherein a capacitive coupling of the pair of coupled interconnects is represented by a capacitor, and wherein the switching factor is determined by:
    dividing the signal waveforms into time regions;
    analyzing a behavior of the capacitor in each of the time regions by determining a value of an effective capacitance as seen from one of the pair of coupled interconnects;
    determining a total effective capacitance by time averaging the effective capacitance values for all time regions; and
    determining the switching factor from the total effective capacitance wherein a time-averaged effective value of the switching factor corresponds to the total effective capacitance.

* * * * *